(12) United States Patent
Streppel et al.

(10) Patent No.: US 10,942,344 B2
(45) Date of Patent: Mar. 9, 2021

(54) OPTOELECTRONIC COMPONENT

(71) Applicant: OSRAM OLED GmbH, Regensburg (DE)

(72) Inventors: Ulrich Streppel, Regensburg (DE); Désirée Queren, Neutraubling (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/462,628

(22) PCT Filed: Dec. 18, 2017

(86) PCT No.: PCT/EP2017/083263
§ 371 (c)(1),
(2) Date: May 21, 2019

(87) PCT Pub. No.: WO2018/114770
PCT Pub. Date: Jun. 28, 2018

(65) Prior Publication Data
US 2020/0064607 A1 Feb. 27, 2020

(30) Foreign Application Priority Data
Dec. 19, 2016 (DE) .................... 10 2016 124 866.5

(51) Int. Cl.
*F21V 7/04* (2006.01)
*G02B 19/00* (2006.01)
(Continued)

(52) U.S. Cl.
CPC .......... *G02B 19/0028* (2013.01); *G02B 3/08* (2013.01); *G02B 19/0066* (2013.01);
(Continued)

(58) Field of Classification Search
None
See application file for complete search history.

(56) References Cited

U.S. PATENT DOCUMENTS 5,228,772 A * 7/1993 Mitchell .................. G02B 3/08
362/183
6,399,874 B1 6/2002 Olah
(Continued)

FOREIGN PATENT DOCUMENTS

DE 10 2010 014 209 A1 10/2011
DE 10 2014 112 891 A1 3/2016
(Continued)

*Primary Examiner* — Vip Patel
(74) *Attorney, Agent, or Firm* — DLA Piper LLP (US)

(57) ABSTRACT

An optoelectronic component includes a light emitter including a multiplicity of image points configured to emit light, and an optical element configured to guide light emitted by the light emitter into a target region, wherein a lower side facing toward the light emitter of the optical element is subdivided into four quadrants, each quadrant includes a Fresnel structure having a multiplicity of ridges extending along concentric annular arcs, the ridges of the Fresnel structure in each quadrant are respectively curved around a center shifted relative to a midpoint of the lower side of the optical element, and the center in each quadrant is arranged at a corner of the lower side of the optical element.

14 Claims, 6 Drawing Sheets

(51) Int. Cl.
*G02B 3/08* (2006.01)
*G02B 27/09* (2006.01)
*H01L 33/58* (2010.01)
*G01S 7/481* (2006.01)

(52) U.S. Cl.
CPC .......... *G02B 27/0955* (2013.01); *H01L 33/58* (2013.01); *G01S 7/4813* (2013.01)

(56) References Cited

U.S. PATENT DOCUMENTS

| | | |
|---|---|---|
| 10,170,672 B2 | 1/2019 | Streppel |
| 2015/0276151 A1 | 10/2015 | Chen |
| 2016/0146426 A1 | 5/2016 | Wu et al. |
| 2019/0074413 A1 | 3/2019 | Streppel |
| 2019/0277478 A1* | 9/2019 | Streppel .................. F21V 5/045 |

FOREIGN PATENT DOCUMENTS

| | | |
|---|---|---|
| DE | 10 2016 104 385 A1 | 9/2017 |
| WO | 2009/129599 A1 | 10/2009 |

* cited by examiner

OPTOELECTRONIC COMPONENT

TECHNICAL FIELD

This disclosure relates to an optoelectronic component.

BACKGROUND

Optoelectronic components with pixelated light sources are known and used to generate structured illumination patterns. The light emitted by the pixelated light source is imaged by projection optics into a target region. Such an optoelectronic component is known, for example, from DE 10 2016 104 385.

SUMMARY

We provide an optoelectronic component including a light emitter including a multiplicity of image points configured to emit light, and an optical element configured to guide light emitted by the light emitter into a target region, wherein a lower side facing toward the light emitter of the optical element is subdivided into four quadrants, each quadrant includes a Fresnel structure having a multiplicity of ridges extending along concentric annular arcs, the ridges of the Fresnel structure in each quadrant are respectively curved around a center shifted relative to a midpoint of the lower side of the optical element, and the center in each quadrant is arranged at a corner of the lower side of the optical element.

We also provide an optoelectronic component including a light emitter including a multiplicity of image points configured to emit light, and an optical element configured to guide light emitted by the light emitter into a target region, wherein a lower side facing toward the light emitter of the optical element is subdivided into four quadrants, each quadrant includes a Fresnel structure having a multiplicity of ridges extending along concentric annular arcs, the ridges of the Fresnel structure in each quadrant are respectively curved around a center shifted relative to a midpoint of the lower side of the optical element, the center in each quadrant is arranged at a corner of the lower side of the optical element, and the quadrants are respectively tilted relative to an orientation parallel to the light emitter.

LIST OF REFERENCES 10 optoelectronic component
11 longitudinal direction
12 transverse direction
13 perpendicular direction
100 light emitter
101 upper side
110 image point
111 image point of a first type
112 image point of a second type
120 two-dimensional matrix arrangement
130 optoelectronic semiconductor chip
140 light
200 optical element
201 upper side
202 lower side
210 quadrant
220 midpoint of the lower side
230 corner of the lower side
300 Fresnel structure
310 ridge
320 annular arc
330 center
400 further Fresnel structure
410 ridge
420 center
500 target region

DETAILED DESCRIPTION

Our optoelectronic component comprises a light emitter comprising a multiplicity of image points configured to emit light, and an optical element configured to guide light emitted by the light emitter into a target region. A lower side, facing toward the light emitter, of the optical element is subdivided into four quadrants. Each quadrant comprises a Fresnel structure having a multiplicity of ridges extending along concentric annular arcs. The ridges of the Fresnel structure in each quadrant are respectively curved around a center shifted relative to a midpoint of the lower side of the optical element.

Advantageously, this optoelectronic component makes it possible to generate a structured light pattern in a target region. The structured light pattern may, for example, be used as a flashlight for photographic recording. The optoelectronic component may, for example, be integrated into a camera or a cellphone.

The light emitter comprising a multiplicity of image points of this optoelectronic component permits shaping of the structured light pattern generatable by the optoelectronic component by controlled activation and deactivation of individual image points of the multiplicity of image points of the light emitter.

The optical element of the optoelectronic component may advantageously have a small overall height in the emission direction of the optoelectronic component, which makes it possible to configure the entire optoelectronic component with compact outer dimensions. The small overall height of the optical element is made possible by the Fresnel structure arranged on the lower side, facing toward the light emitter, of the optical element. These cause guiding of the light emitted by the light emitter by total internal reflection. In this way, imaging optics with a large overall height can be obviated.

By subdivision of the lower side of the optical element into four quadrants, respectively comprising a Fresnel structure with a decentered center, the optical element of the optoelectronic component enables at least partial directional guiding of the light emitted by the light emitter into the target region. This makes it possible to modify the light pattern generated in the target region by controlled activation and deactivation of individual image points of the light emitter. The light emitted by different image points of the light emitter is in this example guided by the optical element into different parts of the target region.

Another advantage of the optoelectronic component is that the optical element arranged over the light emitter prevents visibility of the light emitter of the optoelectronic component from outside the optoelectronic component.

The center, around which the ridges of the Fresnel structure of the respective quadrant are curved, in each quadrant may be arranged at a corner of the lower side of the optical element. Advantageously, this configuration of the quadrants of the optical element makes it possible for light guided by different quadrants of the optical element to be guided into different subregions of the target region.

The ridges of the Fresnel structure in each quadrant respectively may cover a quarter-circle. Advantageously, this configuration of the Fresnel structures of the quadrants of the optical element assists in guiding light by the individual quadrants of the optical element into different parts of the target region.

The quadrants may be squarely shaped. Advantageously, a particularly simple configuration of the optical element is thereby obtained.

An upper side, opposite the lower side of the optical element, may be configured to be planar. Advantageously, the upper side of the optical element therefore has a uniform and harmonious appearance and is insensitive to contamination or damage by external effects.

The quadrants may respectively be tilted relative to an orientation parallel to the light emitter. Advantageously, this helps light guided by different quadrants of the optical element to enter into different sections of the target region.

The quadrants may respectively be tilted such that, in each quadrant, the midpoint of the lower side of the optical element forms a point separated furthest from the light emitter, and a corner of the lower side of the optical element forms a point separated least from the light emitter. Advantageously, light emitted by the light emitter of the optoelectronic component, which is guided by the Fresnel structures of different quadrants of the optical element, therefore enters into different subregions of the target region. In this way, the light pattern generatable by the optoelectronic component in the target region can be specified in a particularly straightforward way by activating and deactivating individual image points of the light emitter.

The four quadrants may be configured mirror-symmetrically with respect to one another. Advantageously, the optical element therefore has a particularly simple geometry.

A further Fresnel structure having at least one ridge enclosing the midpoint of the lower side of the optical element may be formed on the lower side of the optical element. Advantageously, this further Fresnel structure on the lower side of the optical element may guide light emitted by the light emitter into a central region of the target region. This advantageously permits intensely luminous illumination of the central region of the target region by the optoelectronic component.

The at least one ridge of the further Fresnel structure annularly may enclose the midpoint of the lower side of the optical element. Advantageously, a particularly simple geometry of the optical element of the optoelectronic component is therefore obtained, as well as particularly intensely luminous illumination of the central region of the target region.

The image points of the light emitter may be arranged in a two-dimensional matrix arrangement. Advantageously, a simple and regular structure of the light emitter is thereby obtained. The two-dimensional matrix arrangement of the image points of the light emitter allows particularly simple and predictable influencing of the structured light pattern generatable by the optoelectronic component in the target region by influencing the individual image points of the light emitter.

The light emitter may comprise image points of a first type and image points of a second type. The image points of the first type may, for example, differ from the image points of the second type in that the image points of the first type emit light of a different light color, or light with a different color temperature, than the image points of the second type. Advantageously, the optoelectronic component therefore makes it possible to illuminate the target region with light formed by mixing the light emitted by image points of the first type with light emitted by image points of the second type.

The image points of the first type may be configured to emit light with a warm-white color temperature, while the image points of the second type are configured to emit light with a cold-white color temperature. Advantageously, the optoelectronic component therefore makes it possible to illuminate the target region with a mixture of light with a warm-white color temperature and light with a cold-white color temperature.

The image points of the first type and image points of the second type may alternate in a checkerboard fashion. Advantageously, particularly good mixing of the light emitted by image points of the first type with light emitted by image points of the second type is therefore obtained.

The above-described properties, features and advantages, and the way in which they are achieved, will become more clearly and readily comprehensible in conjunction with the following description of examples, which will be explained in more detail in connection with the drawings.

Figure 1:
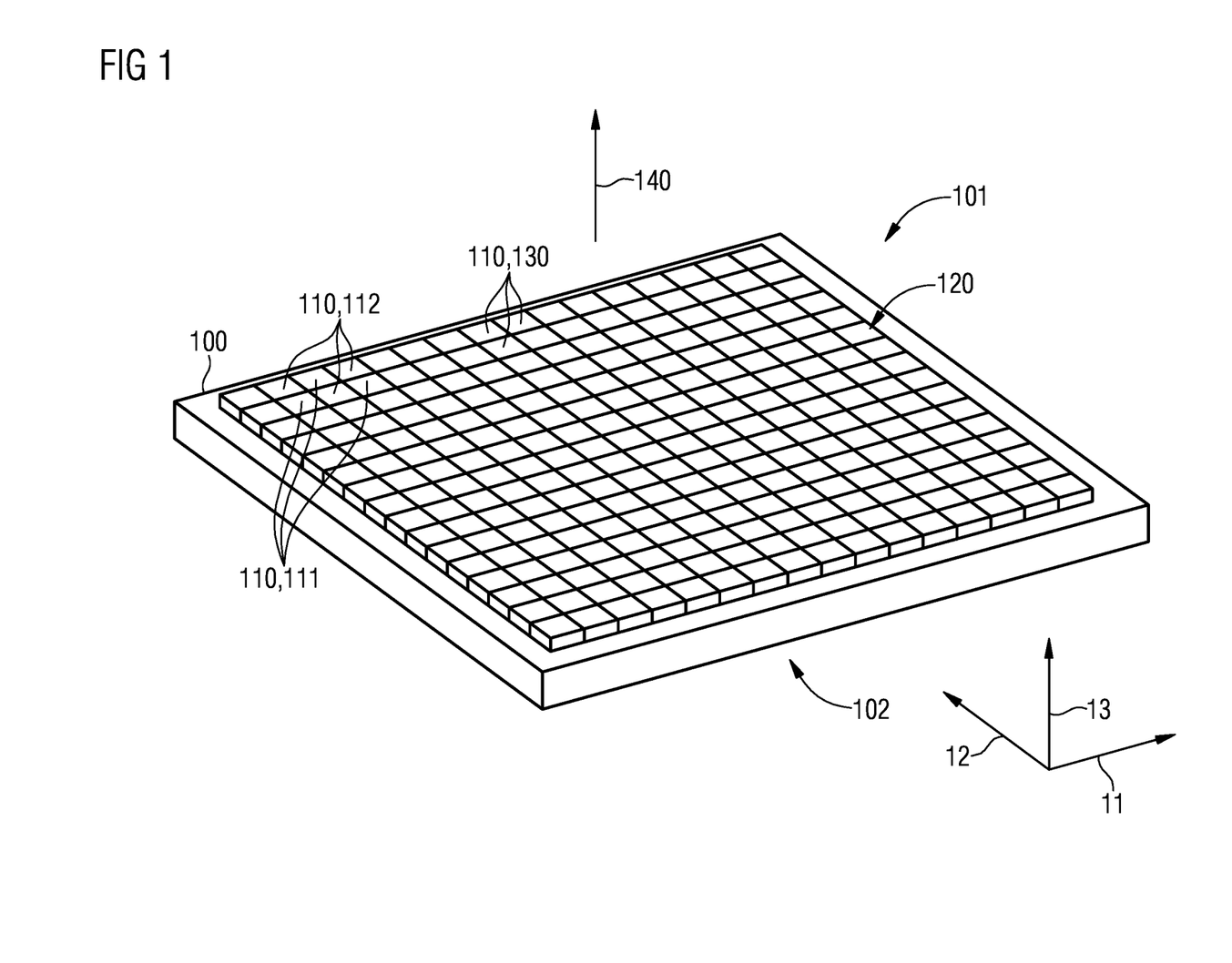
FIG. 1 schematically shows a perspective view of a light emitter.

FIG. 1 shows a schematic perspective representation of a light emitter 100. The light emitter 100 comprises an essentially planar upper side 101 arranged in a plane spanned by a longitudinal direction 11 and a transverse direction 12 perpendicular to the longitudinal direction 11. A direction 13 perpendicular to the upper side 101 of the light emitter 100 is oriented perpendicularly to the longitudinal direction 11 and perpendicularly to the transverse direction 12.

The light emitter 100 comprises a multiplicity of image points 110 configured to emit light 140. The image points 110 in this example emit the light 140 on the upper side 101 of the light emitter 100 in the direction 13 perpendicular to the upper side 101 of the light emitter 100.

Each image point 110 of the light emitter 100 may comprise an optoelectronic semiconductor chip 130 configured to emit light. For example, each image point 110 of the light emitter 100 may comprise a light-emitting diode chip. In addition, each image point 110 may comprise a wavelength-converting element configured to convert light emitted by the optoelectronic semiconductor chip 130 of the respective image point 110 at least partially into light of a different wavelength. In this way, for example, the image points 110 may be configured to emit white light 140. It is also possible to provide a plurality of optoelectronic semiconductor chips 130 per image point 110 of the light emitter 100.

In the example shown in FIG. 1, the image points 110 respectively have a square shape. The image points 110 could, however, also have a different rectangular shape or a non-rectangular shape. In the example shown in FIG. 1, all image points 110 of the light emitter 100 are configured identically, although this is not absolutely necessary. For example, some image points 110 of the light emitter 100 could be larger or have a different shape than other image points 110 of the light emitter 100.

In the example of the light emitter 100 shown in FIG. 1, the image points 110 are arranged in a two-dimensional matrix arrangement 120. The image points 110 may therefore also be referred to as pixels. In the example of the light emitter 100 as shown in FIG. 1, the two-dimensional matrix arrangement 120 comprises 16×16 image points 110. The light emitter 100 may, however, also be configured with a different number of image points 110. The two-dimensional matrix arrangement 120 of the image points 110 need not in this example be square. It is likewise possible to arrange the image points 110 in an arrangement other than a matrix arrangement.

It is expedient that all image points 110 of the light emitter 100 can be driven independently of one another, i.e. they can be switched independently of one another into an illuminating or dark state. It is, however, also possible to configure the light emitter 100 such that the image points 110 are driven groupwise.

The image points 110 of the light emitter 100 may be subdivided into image points 110, 111 of a first type and image points 110, 112 of a second type. The image points 110, 111 of the first type and the image points 110, 112 of the second type may differ by the color or the color temperature of the light 140 emittable by the image points 110. For example, the image points 110, 111 of the first type may be configured to emit colored light with a first light color, while the image points 110, 112 of the second type are configured to emit colored light with a different second light color. It is also possible for the image points 110, 111 of the first type to be configured to emit white light with a first color temperature, while the image points 110, 112 of the second type are configured to emit white light with a second color temperature different from the first color temperature. For example, the image points 110, 111 of the first type may be configured to emit light with a warm-white color temperature. The image points 110, 112 of the second type may, for example, be configured to emit white light with a cold-white light temperature. White light with a warm-white color temperature may, for example, have a color temperature of 2000 K to 3500 K, for example, a color temperature of 2200 K. White light with a cold-white light temperature may, for example, have a color temperature of 3500 K to 7000 K, for example, a color temperature of 5500 K.

In the light emitter 100 shown in FIG. 1, image points 110, 111 of the first type and image points 110, 112 of the second type alternate in a checkerboard fashion. This means that in each row of the two-dimensional matrix arrangement 120 of image points 110 and in each column of the two-dimensional matrix arrangement 120 of image points 110, an image point 110, 111 of the first type and an image point 110, 112 of the second type always follow one another alternately. It is, however, likewise possible to arrange the image points 110, 111 of the first type and the image points 110, 112 of the second type other than in a checkerboard fashion.

In the example of the light emitter 100 as shown in FIG. 1, there are exactly as many image points 110, 111 of the first type as image points 110, 112 of the second type. The number of image points 110, 111 of the first type may, however, also differ from the number of image points 110, 112 of the second type. There may also be more than two types of image points 110 or merely one type of image point 110.

Figure 2:
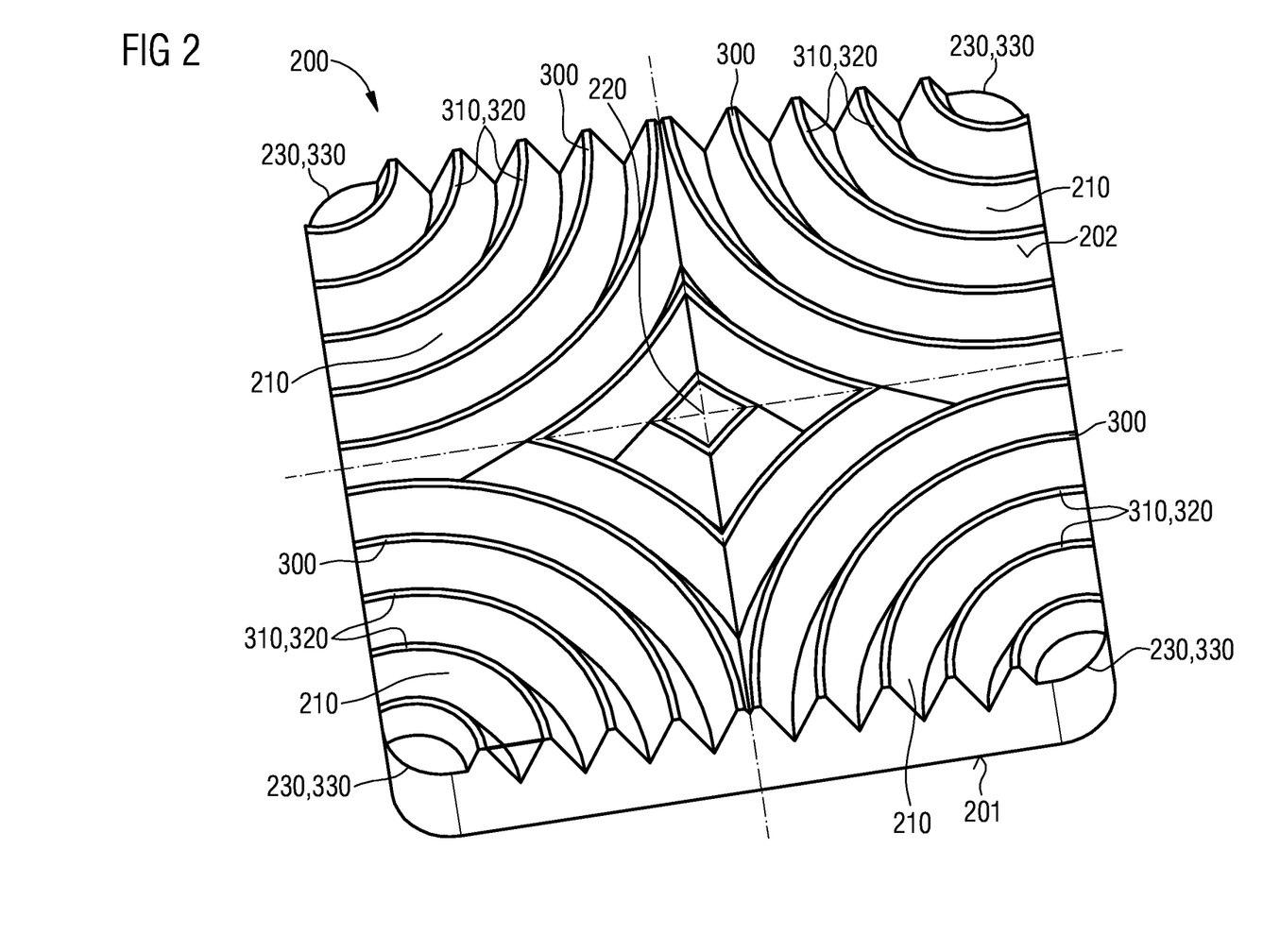
FIG. 2 schematically shows a perspective view of an optical element.

FIG. 2 shows a schematic perspective representation of an optical element 200. The optical element 200 comprises a lower side 202, which can be seen in FIG. 2, and an upper side 201 opposite the lower side 202. The upper side 201 and the lower side 202 of the optical element 200 respectively have an essentially square shape in the example shown in FIG. 2. The upper side 201 and the lower side 202 of the optical element 200 could, however, also have a different rectangular shape or a nonrectangular shape.

The lower side 202 of the optical element 200 comprises four corners 230. In the example shown in FIG. 2, the corners 230 of the lower side 202 of the optical element 200 are rounded. This is not absolutely necessary.

The lower side 202 of the optical element 200 is subdivided into four quadrants 210. Each quadrant 210 comprises one fourth of the lower side 202 of the optical element 200. All four quadrants 210 meet at a midpoint 220 of the lower side 202 of the optical element 200. Each of the four corners 230 of the lower side 202 of the optical element 200 forms a corner of a quadrant 210. In the example of the optical element 200 shown in FIG. 2, the quadrants 210 are respectively configured squarely. If the lower side 202 of the optical element 200 is nonsquare, the quadrants 210 could also be configured nonsquarely.

Each quadrant 210 of the lower side 202 of the optical element 200 comprises a Fresnel structure 300 having a multiplicity of ridges 310. The ridges 310 extend along concentric annular arcs 320 on the lower side 202 of the optical element 200. In this example, the Fresnel structure 300 of each quadrant 210 comprises a plurality of concentrically arranged ridges 310, in the example shown in FIG. 2 respectively seven ridges 310.

The ridges 310 may also be referred to as ribs or elevations, and in the example shown in FIG. 2 respectively have an essentially triangular cross section. In this way, a cavity likewise having an approximately triangular shape in cross section is respectively arranged between two adjacent ridges 310.

The annular arcs 320, along which the ridges 310 of the Fresnel structures 300 extend, are in each quadrant 210 of the optical element 200 respectively curved around a center 330 shifted relative to the midpoint 220 of the lower side 202 of the optical element 200. In the example shown in FIG. 2, the centers 330 of the annular arcs 320, along which the ridges 310 of the Fresnel structures 330 extend, in each quadrant 210 of the optical element 200 coincide with the corner 230, belonging to the respective quadrant 210, of the lower side 202 of the optical element 200.

The centers 330 of the annular arcs 320 need not lie exactly at the corners 230 of the lower side 202 of the optical element 200. The centers 330 may also lie outside the lower side 202 of the optical element 200, and in this example respectively have a distance from the respective corner 230 which is at most three times the edge length of the light emitter 100.

The annular arcs 320, along which the ridges 310 of the Fresnel structures 300 extend, form sections of circle arcs. Since the annular arcs 320 in the example represented are curved around the centers 330 coinciding with the corners 230 of the lower side 202 of the optical element 200, almost every ridge 310 extending along an annular arc 320 of each Fresnel structure 300 covers a quarter-circle and meets outer edges of the lower side 202 of the optical element 200 perpendicularly. Only ridges 310 of each Fresnel structure 300 arranged near to the midpoint 220 of the lower side 202 of the optical element 200 do not cover a full quarter-circle, but merge at the edges of the respective quadrant 210 into corresponding ridges 310 of the Fresnel structure 300 of the respectively adjacent quadrant 210.

If the mutually diagonally opposite quadrants 210 of the lower side 202 of the optical element 200 were respectively interchanged, the ridges 310 of the Fresnel structures 300 of the four quadrants 210 would together form closed rings. Unclosed sections of further ridges would respectively be arranged in the corners.

The four quadrants 210 of the lower side 202 of the optical element 200 are configured mirror-symmetrically with respect to one another.

Figure 3:
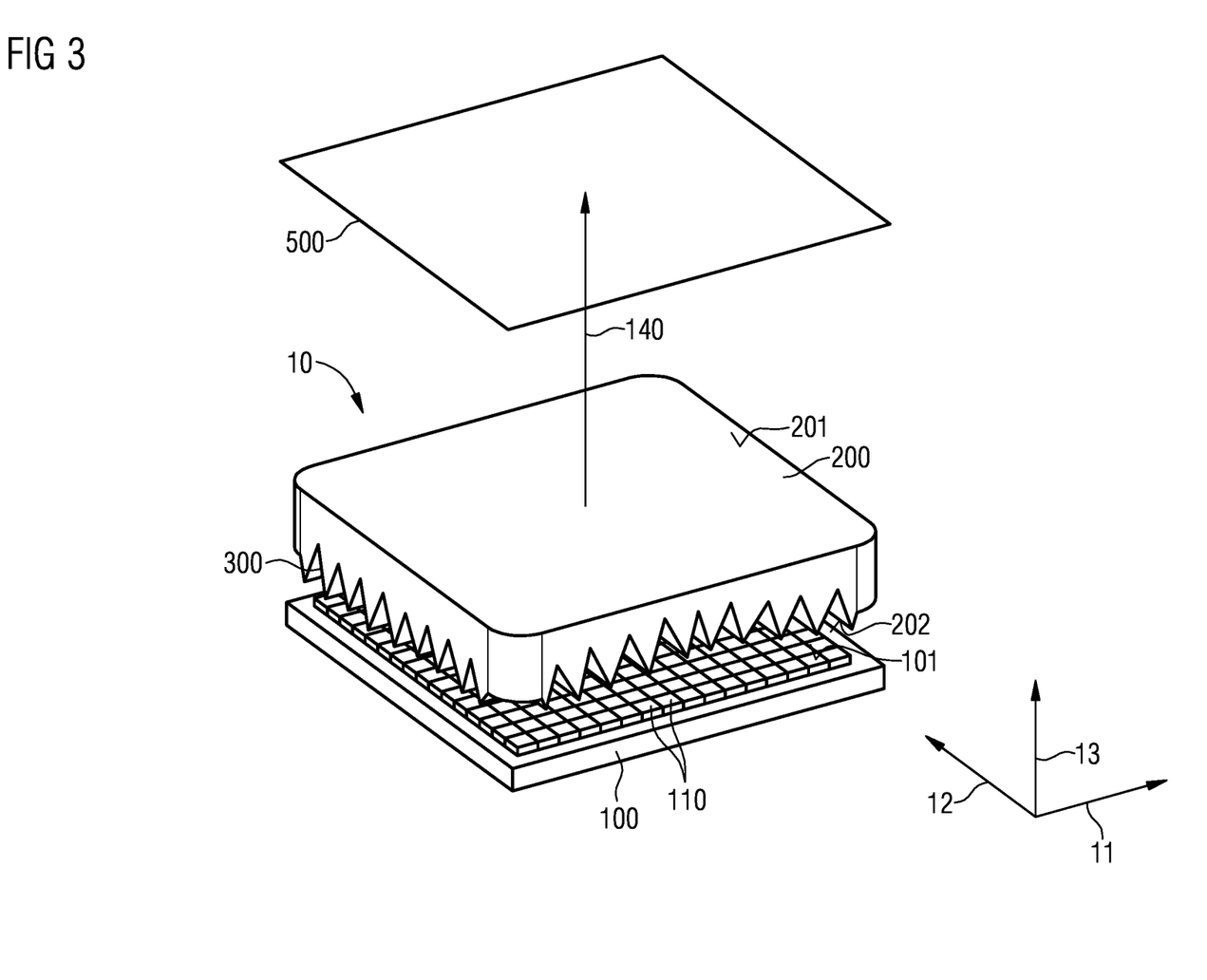
FIG. 3 schematically shows a perspective view of an optoelectronic component comprising the light emitter and the optical element.

FIG. 3 shows a schematic perspective representation of an optoelectronic component 10. The optoelectronic component 10 is configured to generate a structured light pattern in a target region 500 in the vicinity of the optoelectronic component 10. The structured light pattern may, for example, be used as a flashlight for photographic recording. The optoelectronic component 10 may, for example, be integrated into a camera or a cellphone.

The optoelectronic component 10 comprises the light emitter 100 represented in FIG. 1 and the optical element 200 represented in FIG. 2. In addition, the optoelectronic component 10 may comprise further component parts not represented in FIG. 3 for the sake of clarity. For example, the optoelectronic component 10 may comprise a housing that holds and fixes the light emitter 100 and the optical element 200.

The optical element 200 is arranged above the upper side 101 of the light emitter 100 in the perpendicular direction 13. In this example, the lower side 202 of the optical element 200 faces toward the upper side 101 of the light emitter 100. The lower side 202 of the optical element 200 has approximately the same shape and size as the upper side 101 of the light emitter 100, or is somewhat larger than the upper side 101 of the light emitter 100. The upper side 101 of the light emitter 100 is therefore essentially arranged entirely below the lower side 202 of the optical element 200.

The upper side 201, facing away from the light emitter 100, of the optical element 200 is configured to be planar. The optoelectronic component 10 therefore has a homogeneous appearance as viewed from the outside. The planar upper side 201 of the optical element 200 is furthermore advantageously insensitive to damage and contamination by external effects.

The optical element 200 of the optoelectronic component 10 is intended to guide light 140 emitted by the light emitter 100 of the optoelectronic component 10 into the target region 500. The target region 500 is arranged above the upper side 201 of the optical element 200 in the perpendicular direction 13. The target region 500 may, for example, be arranged at a distance of 1 m from the optoelectronic component 10. The light emitter 100 and the optical element of the optoelectronic component 10 may, for example, have edge lengths of a few mm.

The optical element 200 guides the light 140 emitted by the image points 110 of the light emitter 100 by the Fresnel structures 300 on the lower side 202 of the optical element 200. The guiding is in this example carried out by total internal reflection in the ridges 310 of the Fresnel structures 300.

The effect achieved by the subdivision of the lower side 202 of the optical element 200 into the four quadrants 210 and the geometry of the Fresnel structures 300 of the quadrants 210 is that light 140 emitted by different image points 110 of the light emitter 100 of the optoelectronic component 10 is directed into different parts of the target region 500. This makes it possible to vary the light pattern obtained in the target region 500 by selective switching of individual image points 110 of the light emitter 100 into the light-emitting or dark state.

At the same time, light 140 emitted by image points 110 of the light emitter 100 lying close to one another is superimposed in the target region 500 so that light 140 emitted by image points 110, 111 of the first type and light 140 emitted by image points 110, 112 of the second type is mixed in the target region 500.

Figure 4:
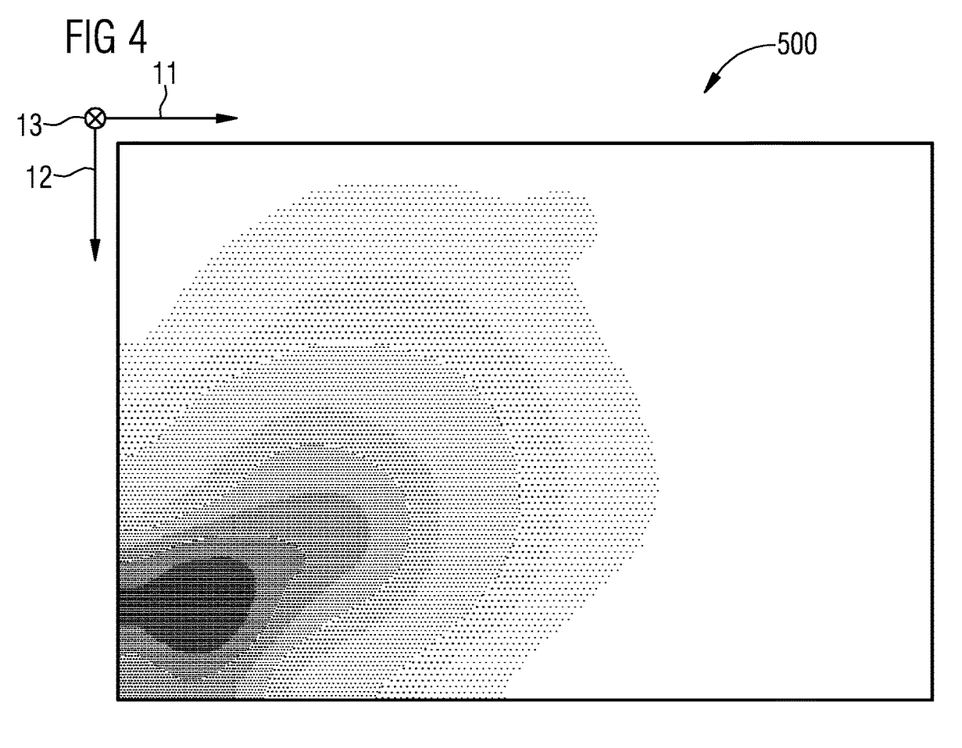
FIG. 4 schematically shows a view of a target region illuminated by the optoelectronic component.

FIG. 4 shows a schematic exemplary representation of an image plane, arranged in the target region 500 oriented parallel to the longitudinal direction 11 and the transverse direction 12. FIG. 4 shows in a schematized way an illuminance distribution set up in the target region 500 in an example in which, in the light emitter 100 of the optoelectronic component 10, only a few image points 110 in a corner region of the two-dimensional matrix arrangement 120 emit light 140, while all other image points 110 of the light emitter 100 are dark. In FIG. 4, an increased illuminance is set up in a corner region of the target region 500 compared to the other parts of the target region 500. Correspondingly, image points 110 activated in another corner region of the two-dimensional matrix arrangement 120 of the light emitter 100 would lead to an increased illuminance in another corner region of the target region 500. Image points 110 activated in the central region of the two-dimensional matrix arrangement 120 of the light emitter 100 of the optoelectronic component 10 would generate an increased illuminance in the central part of the target region 500.

Figure 5:
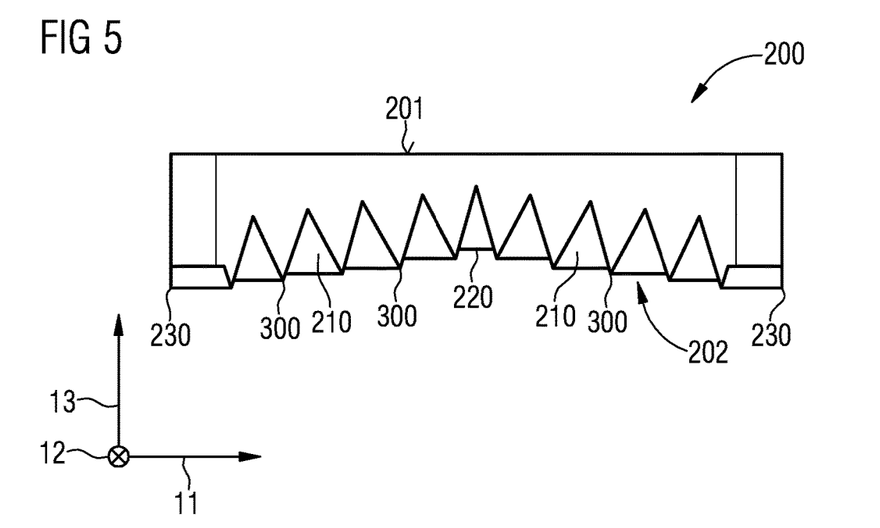
FIG. 5 schematically shows a side view of an alternative example of the optical element.

FIG. 5 shows a schematic sectional side view of an alternative example of the optical element 200. The example of the optical element 200 as shown in FIG. 5 may be used instead of the example of the optical element 200 as shown in FIG. 2 in the optoelectronic component 10.

In the example of the optical element 200 as shown in FIG. 5, the quadrants 210 of the lower side 202 of the optical element 200 are respectively tilted relative to an orientation parallel to the longitudinal direction 11 and the transverse direction 12. The quadrants 210 are thus rotated both about the longitudinal direction 11 and about the transverse direction 12. If the optical element 200 of FIG. 5 is arranged in the optoelectronic component 10 over the upper side 101 of the light emitter 100, the quadrants 210 of the lower side 202 of the optical element 200 are respectively tilted relative to an orientation parallel to the upper side 101 of the light emitter 100.

In this example, the quadrants 210 are respectively tilted such that, in each quadrant 210, the midpoint 220 of the lower side 202 of the optical element 200 forms a point separated furthest from the light emitter 100, and at the same time in each quadrant 210 and the corner 230, associated with the respective quadrant 210, of the lower side 202 of the optical element 200 forms a point separated least from the light emitter 100.

The effect achieved by tilting the quadrants 210 of the example of the optical element 200 shown in FIG. 5 is that light 140 emitted by the image points 110 of the light emitter 100 of the optoelectronic component 10 is guided more strongly in the direction of the corners of the target region 500 than when using the variant of the optical element 200 shown in FIG. 2.

Figure 6:
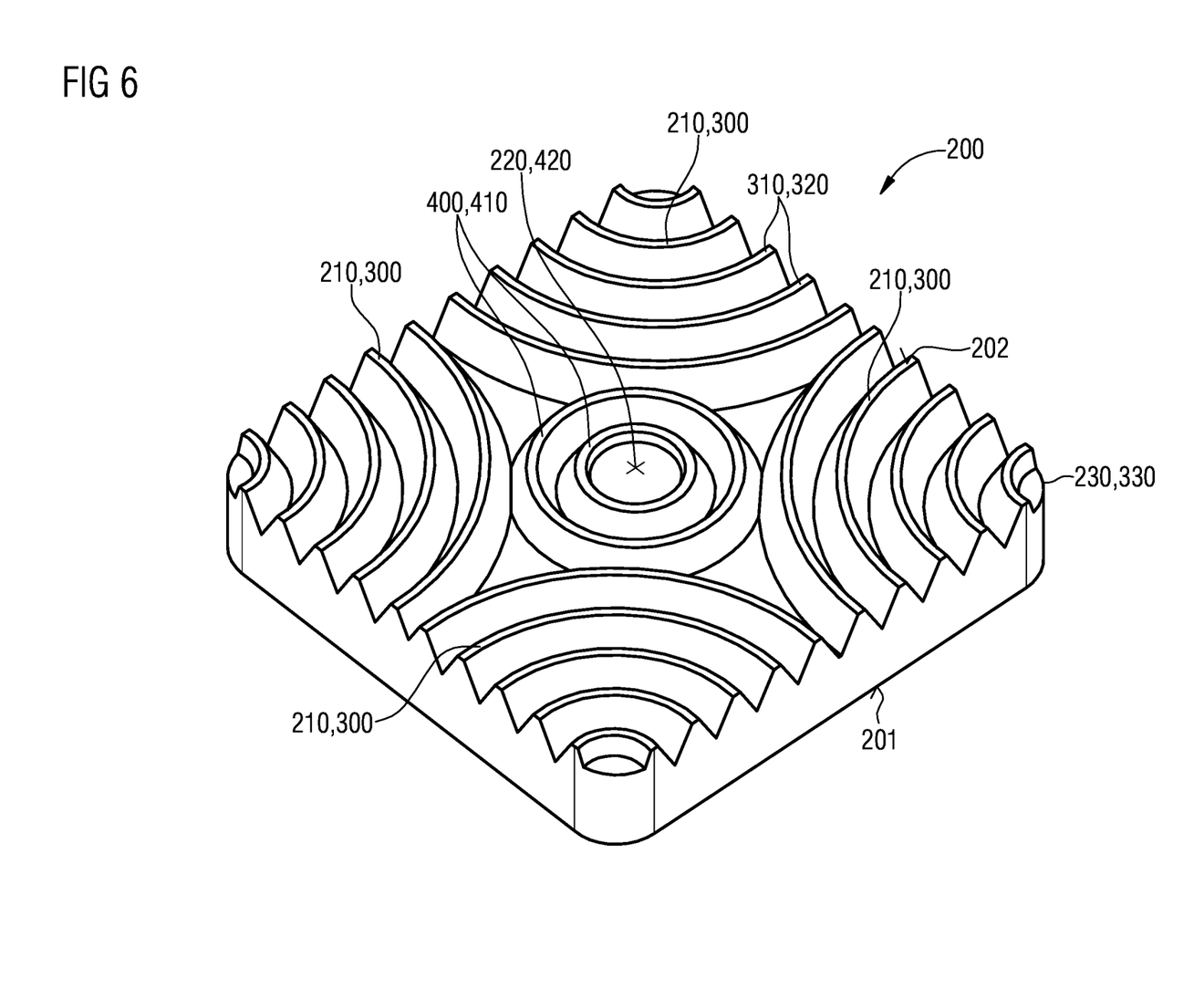
FIG. 6 schematically shows a perspective view of a further example of the optical element.

FIG. 6 shows a schematic perspective representation of a further example of the optical element 200. The example of the optical element 200 shown in FIG. 6 may be used instead of the example of the optical element 200 shown in FIG. 2 in the optoelectronic component 10 of FIG. 3.

The example of the optical element 200 shown in FIG. 6 differs from the of the optical element 200 shown in FIG. 2 in that a further Fresnel structure 400 having a plurality of ridges 410 enclosing the midpoint 220 of the lower side 202 of the optical element 200 is formed on the lower side 202 of the optical element 200. The ridges 410 of the further Fresnel structure 400 of the variant of the optical element 200 shown in FIG. 6 replace the ridges 310, lying closest to the midpoint 220 of the lower side 202, of the Fresnel structures 300 of the variant of the optical element 200 shown in FIG. 2.

The ridges 410 of the further Fresnel structure 400 are curved circularly around a center 420 which coincides with the midpoint 220 of the lower side 202 of the optical element 200. In this example, the individual ridges 410 of the further Fresnel structure 400 are arranged concentrically around the center 420.

The ridges 410 of the further Fresnel structure 400 may, for example, respectively have a triangular cross section.

The effect of the further Fresnel structure 400 of the variant of the optical element 200 shown in FIG. 6 is that an additional part, compared to the variant of the optical element 200 shown in FIG. 2, of the light 140 emitted by the image points 110 of the light emitter 100 is directed into the central region of the target region 500 when the variant of the optical element 200 shown in FIG. 6 is used in the optoelectronic component 10. In this way, when using the variant of the optical element 200 shown in FIG. 6, a greater brightness is achieved in the central part of the target region 500, particularly when image points 110 activated in the central part of the two-dimensional matrix arrangement 120 of the light emitter 100 are activated.

Figure 7:
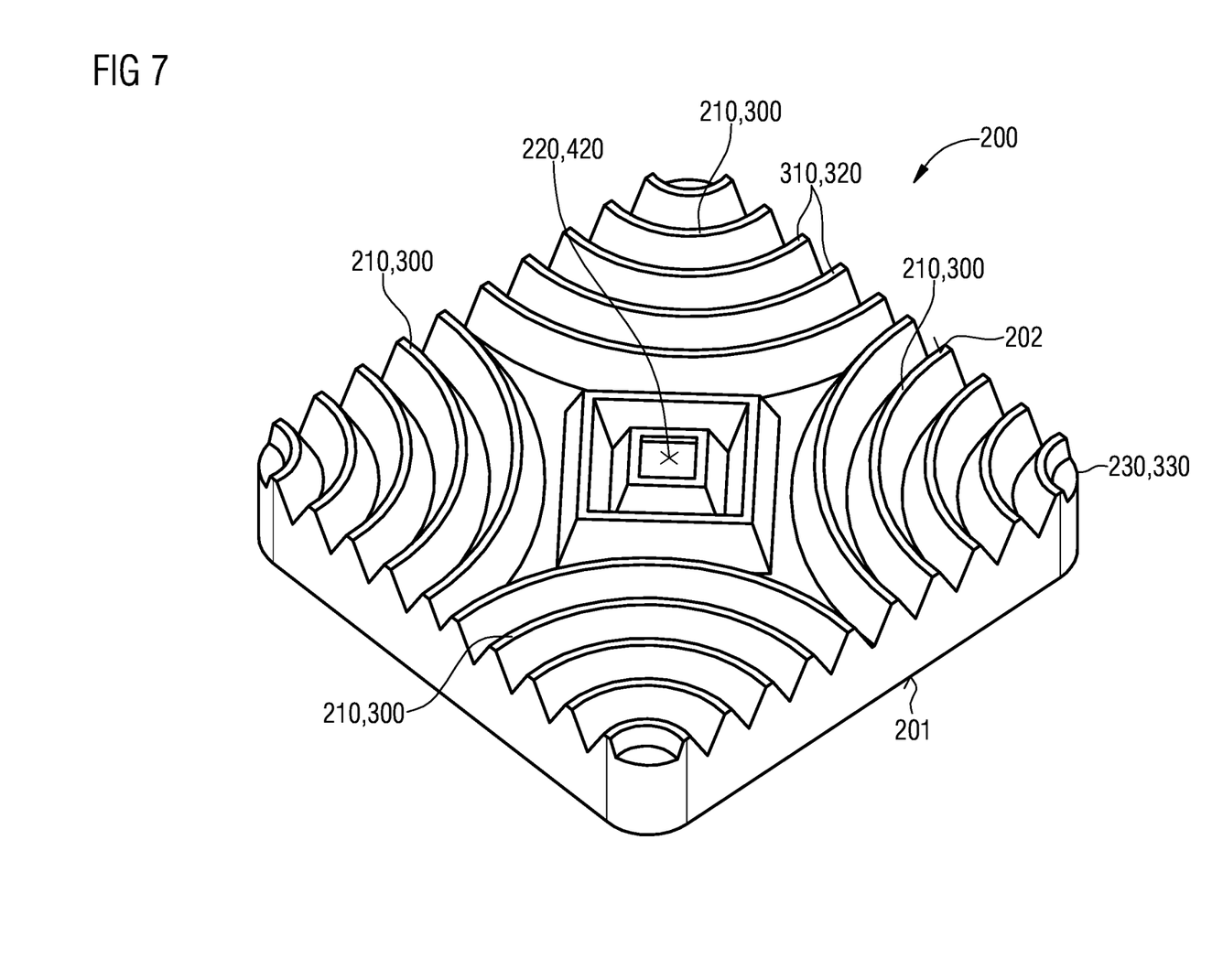
FIG. 7 schematically shows a perspective view of a further example of the optical element.

FIG. 7 shows a further example of the optical element 200 in a schematic perspective representation. The variant of the optical element 200 shown in FIG. 7 may be used instead of the variant of the optical element 200 shown in FIG. 2 in the optoelectronic component 10 shown in FIG. 3.

The variant of the optical element 200 shown in FIG. 7 has great similarities with the variant of the optical element 200 shown in FIG. 6. In the variant of the optical element 200 shown in FIG. 7, however, the ridges 410 of the further Fresnel structure 400 in the central region of the lower side 202 of the optical element 200 are configured not to be circular but diamond-shaped. The ridges 410 of the further Fresnel structure 400 in this example respectively comprise four sections arranged in the four quadrants 210 of the lower side 202 of the optical element 200. Each of these sections of the ridges 410 of the further Fresnel structure 400 extends in a straight line.

Our components have been illustrated and described in detail with the aid of preferred examples. This disclosure is not, however, restricted by the examples disclosed. Rather, other variants may be derived therefrom by those skilled in the art without departing from the protective scope of the appended claims.

This application claims priority of DE 10 2016 124 866.5, the subject matter of which is incorporated herein by reference.

The invention claimed is:

1. An optoelectronic component comprising:
a light emitter comprising a multiplicity of image points configured to emit light, and
an optical element configured to guide light emitted by the light emitter into a target region,
wherein a lower side facing toward the light emitter of the optical element is subdivided into four quadrants,
each quadrant comprises a Fresnel structure having a multiplicity of ridges extending along concentric annular arcs,
the ridges of the Fresnel structure in each quadrant are respectively curved around a center shifted relative to a midpoint of the lower side of the optical element, and
the center in each quadrant is arranged at a corner of the lower side of the optical element.

2. The optoelectronic component according to claim 1, wherein the ridges of the Fresnel structure in each quadrant respectively cover a quarter-circle.

3. The optoelectronic component according to claim 1, wherein the quadrants are squarely shaped.

4. The optoelectronic component according to claim 1, wherein an upper side opposite the lower side of the optical element is planar.

5. The optoelectronic component according to claim 1, wherein the quadrants are respectively tilted relative to an orientation parallel to the light emitter.

6. The optoelectronic component according to claim 5, wherein the quadrants are respectively tilted such that, in each quadrant, the midpoint of the lower side of the optical element forms a point separated furthest from the light emitter, and a corner of the lower side of the optical element forms a point separated least from the light emitter.

7. The optoelectronic component according to claim 1, wherein the four quadrants are configured mirror-symmetrically with respect to one another.

8. The optoelectronic component according to claim 1, further comprising a further Fresnel structure having at least one ridge enclosing the midpoint of the lower side of the optical element formed on the lower side of the optical element.

9. The optoelectronic component according to claim 8, wherein the at least one ridge of the further Fresnel structure annularly encloses the midpoint of the lower side of the optical element.

10. The optoelectronic component according to claim 1, wherein the image points of the light emitter are arranged in a two-dimensional matrix arrangement.

11. The optoelectronic component according to claim 1, wherein the light emitter comprises image points of a first type and image points of a second type.

12. The optoelectronic component according to claim 11, wherein the image points of the first type are configured to emit light with a warm-white color temperature, and the image points of the second type are configured to emit light with a cold-white color temperature.

13. The optoelectronic component according to claim 11, wherein image points of the first type and image points of the second type alternate in a checkerboard fashion.

14. An optoelectronic component comprising:
a light emitter comprising a multiplicity of image points configured to emit light, and
an optical element configured to guide light emitted by the light emitter into a target region,
wherein a lower side facing toward the light emitter of the optical element is subdivided into four quadrants,
each quadrant comprises a Fresnel structure having a multiplicity of ridges extending along concentric annular arcs,
the ridges of the Fresnel structure in each quadrant are respectively curved around a center shifted relative to a midpoint of the lower side of the optical element, the center in each quadrant is arranged at a corner of the lower side of the optical element, and the quadrants are respectively tilted relative to an orientation parallel to the light emitter.

* * * * *